(12) United States Patent
Takano et al.

(10) Patent No.: US 10,879,423 B2
(45) Date of Patent: Dec. 29, 2020

(54) ULTRAVIOLET LIGHT-EMITTING ELEMENT

(71) Applicants: PANASONIC CORPORATION, Osaka (JP); RIKEN, Saitama (JP)

(72) Inventors: Takayoshi Takano, Osaka (JP); Takuya Mino, Osaka (JP); Jun Sakai, Osaka (JP); Norimichi Noguchi, Osaka (JP); Hideki Hirayama, Saitama (JP)

(73) Assignees: PANASONIC CORPORATION, Osaka (JP); RIKEN, Saitama (JP)

( * ) Notice: Subject to any disclaimer, the term of this patent is extended or adjusted under 35 U.S.C. 154(b) by 0 days.

(21) Appl. No.: 16/073,189

(22) PCT Filed: Nov. 1, 2016

(86) PCT No.: PCT/JP2016/004778
§ 371 (c)(1),
(2) Date: Jul. 26, 2018

(87) PCT Pub. No.: WO2017/134709
PCT Pub. Date: Aug. 10, 2017

(65) Prior Publication Data
US 2019/0067521 A1    Feb. 28, 2019

(30) Foreign Application Priority Data
Feb. 1, 2016    (JP) ................................. 2016-016987

(51) Int. Cl.
*H01L 33/32*    (2010.01)
*H01L 33/06*    (2010.01)
(Continued)

(52) U.S. Cl.
CPC .......... *H01L 33/325* (2013.01); *H01L 33/007* (2013.01); *H01L 33/0025* (2013.01);
(Continued)

(58) Field of Classification Search
CPC .... H01L 33/0025; H01L 33/32; H01L 33/325
See application file for complete search history.

(56) References Cited

U.S. PATENT DOCUMENTS 6,337,493 B1 *   1/2002   Tanizawa ............... B82Y 20/00
                                               257/13
9,112,111 B2 *   8/2015   Nago .................... H01L 33/007
                     (Continued)

FOREIGN PATENT DOCUMENTS

JP    2011-187591    9/2011
JP    2013-055293    3/2013
             (Continued)

OTHER PUBLICATIONS

Extended European Search Report issued in corresponding European Patent Application No. 16 889 200.8 dated Feb. 12, 2019.
(Continued)

*Primary Examiner* — Cuong Q Nguyen
*Assistant Examiner* — Peter M Albrecht
(74) *Attorney, Agent, or Firm* — Greenblum & Bernstein, P.L.C.

(57) ABSTRACT

An ultraviolet light-emitting element includes: a multilayer stack in which an n-type AlGaN layer, a light-emitting layer, a first p-type AlGaN layer, and a second p-type AlGaN layer are arranged in this order; a negative electrode; and a positive electrode. The first p-type AlGaN layer has a larger Al composition ratio than first AlGaN layers serving as well layers. The second p-type AlGaN layer has a larger Al composition ratio than the first AlGaN layers. The first p-type AlGaN layer and the second p-type AlGaN layer both contain Mg. The second p-type AlGaN layer has a higher maximum Mg concentration than the first p-type AlGaN layer. The second p-type AlGaN layer includes a region where an Mg concentration increases in a thickness direction (Continued)

thereof as a distance from the first p-type AlGaN layer increases in the thickness direction.

5 Claims, 5 Drawing Sheets

(51) Int. Cl.
    *H01L 33/02* (2010.01)
    *H01L 33/00* (2010.01)
    *H01L 33/14* (2010.01)
    *H01L 33/24* (2010.01)
    *H01L 33/38* (2010.01)
    *H01L 33/12* (2010.01)

(52) U.S. Cl.
    CPC ............ *H01L 33/025* (2013.01); *H01L 33/06* (2013.01); *H01L 33/14* (2013.01); *H01L 33/24* (2013.01); *H01L 33/32* (2013.01); *H01L 33/38* (2013.01); *H01L 33/12* (2013.01)

(56) References Cited

U.S. PATENT DOCUMENTS

| | | |
|---|---|---|
| 2008/0076199 A1 | 3/2008 | Akita et al. |
| 2011/0128981 A1 | 6/2011 | Kinoshita et al. |
| 2013/0059407 A1 | 3/2013 | Miyazaki et al. |
| 2013/0328013 A1* | 12/2013 | Inazu .................... H01L 33/405 257/13 |
| 2014/0054633 A1* | 2/2014 | Kim ........................ H01L 33/58 257/98 |
| 2014/0138726 A1* | 5/2014 | Yamane ................ H01L 33/007 257/98 |
| 2014/0231745 A1* | 8/2014 | Northrup .............. H01S 5/0421 257/13 |
| 2015/0084069 A1 | 3/2015 | Kushibe et al. |
| 2017/0110852 A1* | 4/2017 | Mino ..................... H01L 33/02 |
| 2018/0033913 A1* | 2/2018 | Furuya ................... H01L 33/12 |

FOREIGN PATENT DOCUMENTS

| | | | |
|---|---|---|---|
| JP | 2015-065245 | 4/2015 | |
| WO | WO-2007124723 A1 * | 11/2007 | ........... H01L 33/025 |
| WO | 2008/117750 | 10/2008 | |
| WO | 2015/151471 | 10/2015 | |
| WO | WO-2015151471 A1 * | 10/2015 | |

OTHER PUBLICATIONS

International Search Report issued in International Pat. Appl. No. PCT/JP2016/004778, dated Dec. 6, 2016.
International Preliminary Report on Patentability issued in International Pat. Appl. No. PCT/JP2016/004778, dated Aug. 7, 2018.

* cited by examiner

ULTRAVIOLET LIGHT-EMITTING ELEMENT

TECHNICAL FIELD

The present invention generally relates to ultraviolet light-emitting elements, and more particularly relates to an ultraviolet light-emitting element configured to emit an ultraviolet ray.

BACKGROUND ART

It has been proposed that an ultraviolet light-emitting element use a p-type AlGaN layer with an Al composition ratio of 0.5 or more (see Patent Literature 1).

Patent Literature 1 describes, as an exemplary p-type AlGaN layer with an Al composition ratio of 0.5 or more, a p-type AlGaN layer doped with acceptor dopant atoms at a concentration within a range from $5 \times 10^{18}$ cm$^{-3}$ to $1 \times 10^{20}$ cm$^{-3}$.

Patent Literature 1 also describes that using such a p-type AlGaN layer paves the way for fabricating light-emitting diodes and laser diodes for emitting light in a deep ultraviolet region of 300 nm or less.

There has been a growing demand for extending the life of an ultraviolet light-emitting element which uses a p-type AlGaN layer as a contact layer with an electrode.

CITATION LIST

Patent Literature

Patent Literature 1: WO 2008/117750

SUMMARY OF INVENTION

It is therefore an object of the present invention to provide an ultraviolet light-emitting element that would have a longer life.

An ultraviolet light-emitting element according to an aspect of the present invention includes: a multilayer stack in which an n-type AlGaN layer, a light-emitting layer, a first p-type AlGaN layer, and a second p-type AlGaN layer are arranged in this order; a negative electrode provided directly on a portion of one surface of the n-type AlGaN layer, the portion being not covered with the light-emitting layer, the one surface being located closer to the light-emitting layer; and a positive electrode provided directly on a surface of the second p-type AlGaN layer. The light-emitting layer has a multi-quantum well structure in which a plurality of barrier layers and a plurality of well layers are alternately arranged. Each of the plurality of well layers is configured as a first AlGaN layer. Each of the plurality of barrier layers is configured as a second AlGaN layer having a larger Al composition ratio than the first AlGaN layer. The n-type AlGaN layer has a larger Al composition ratio than the first AlGaN layer. The first p-type AlGaN layer has a larger Al composition ratio than the first AlGaN layer. The second p-type AlGaN layer has a larger Al composition ratio than the first AlGaN layer. The first p-type AlGaN layer and the second p-type AlGaN layer both contain Mg. The second p-type AlGaN layer has a higher maximum Mg concentration than the first p-type AlGaN layer. The second p-type AlGaN layer includes a region where an Mg concentration increases in a thickness direction of the second p-type AlGaN layer as a distance from the first p-type AlGaN layer increases in the thickness direction.

DESCRIPTION OF EMBODIMENTS

Note that FIGS. 1, 2, 4, and 5 to be referred to in the following description of embodiments are schematic representations and the dimensions and thicknesses of respective constituent members illustrated in these drawings and their ratios are not always to scale, compared to actual ones. Also, note that the materials, the numerical values, and other specifics presented in the following description of embodiments are only a typical example of the present invention and should not be construed as limiting. Rather, numerous modifications or variations can be readily made by those skilled in the art without departing from the true spirit and scope of the invention.

EMBODIMENTS

Figure 1:
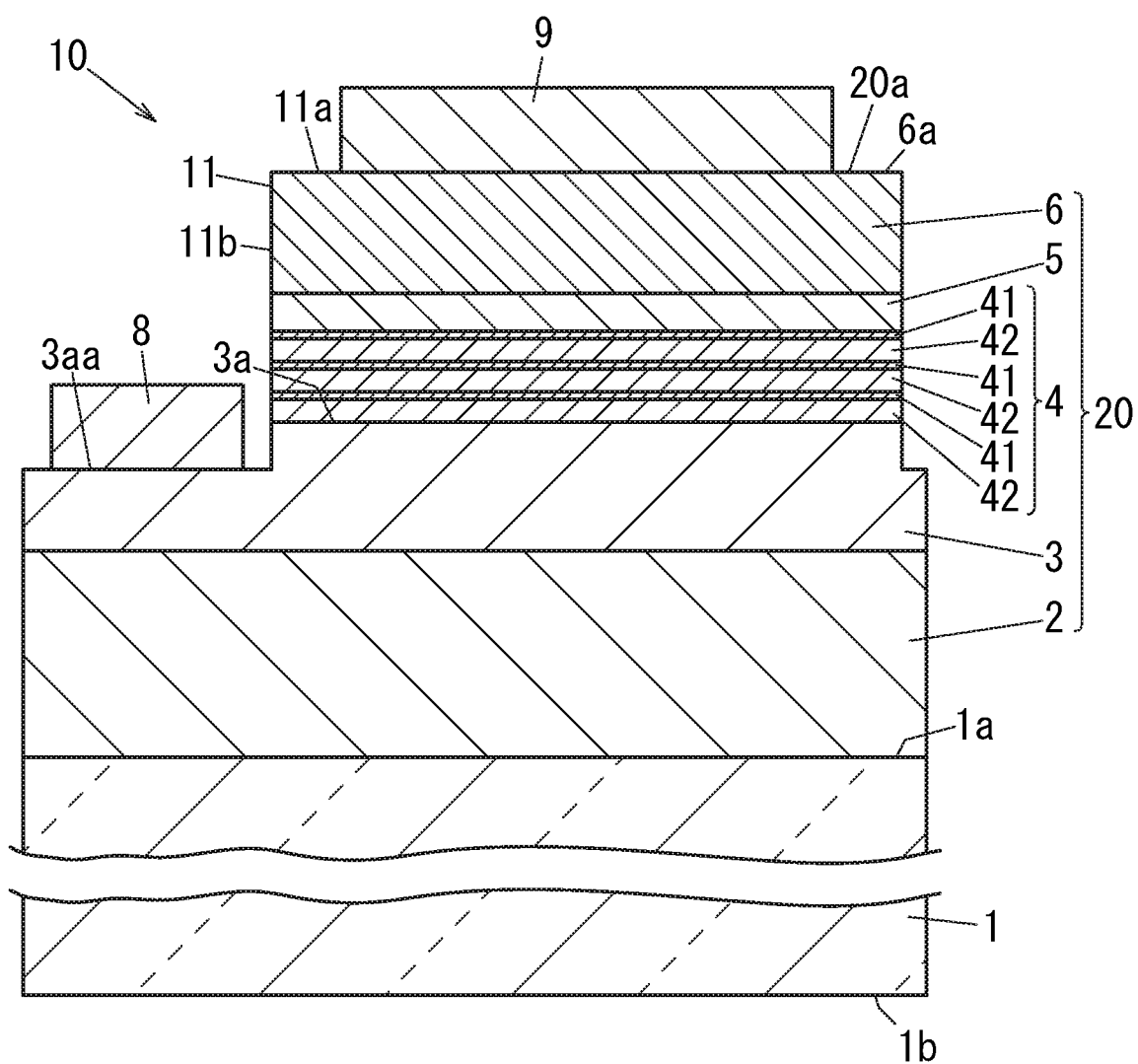
FIG. 1 is a schematic cross-sectional view of an ultraviolet light-emitting element according to an embodiment of the present invention.

An ultraviolet light-emitting element 10 according to an exemplary embodiment will be described with reference to FIGS. 1 and 2.

The ultraviolet light-emitting element 10 includes a multilayer stack 20 in which an n-type AlGaN layer 3, a light-emitting layer 4, a first p-type AlGaN layer 5, and a second p-type AlGaN layer 6 are arranged in this order. The ultraviolet light-emitting element 10 further includes a negative electrode 8 provided directly on a portion 3aa, not covered with the light-emitting layer 4, of one surface 3a, located closer to the light-emitting layer 4, of the n-type AlGaN layer 3, and a positive electrode 9 provided directly on a surface 6a of the second p-type AlGaN layer 6.

The ultraviolet light-emitting element 10 further includes a substrate 1 to support the multilayer stack 20 thereon. The multilayer stack 20 is provided on one surface 1a of the substrate 1. The n-type AlGaN layer 3, the light-emitting layer 4, the first p-type AlGaN layer 5, and the second p-type AlGaN layer 6 are arranged in this order with respect to the one surface 1a of the substrate 1. In the ultraviolet light-emitting element 10, the multilayer stack 20 suitably further includes a buffer layer 2 interposed between the substrate 1 and the n-type AlGaN layer 3. In the ultraviolet light-emitting element 10, the first p-type AlGaN layer 5 serves as an electron blocking layer. The electron blocking layer is provided to block electrons coming from one side, including the light-emitting layer 4, of the multilayer stack 20 in the thickness direction thereof.

The multilayer stack 20 may be formed by an epitaxial growth process, which may be a metalorganic vapor phase epitaxy (MOVPE) process, for example. However, this is only an example and should not be construed as limiting. The epitaxial growth process does not have to be an MOVPE process, but may also be, for example, a hydride vapor phase epitaxy (HVPE) process, a molecular beam epitaxy (MBE) process, or any other suitable process.

The light-emitting layer 4 has a multi-quantum well structure in which a plurality of barrier layers 42 and a plurality of well layers 41 are alternately arranged. Each of the plurality of well layers 41 is configured as a first AlGaN layer. Each of the plurality of barrier layers 42 is configured as a second AlGaN layer having a larger Al composition ratio than the first AlGaN layer. The first AlGaN layer and the second AlGaN layer are undoped AlGaN layers. The first AlGaN layer and the second AlGaN layer may include Mg, H, Si, C, O, and other impurities to be inevitably contained during their growth process. The concentrations of these impurities (Mg, H, Si, C, O) are herein values measured by secondary ion mass spectroscopy (SIMS). Specifically, the undoped AlGaN layers had the following impurity concentrations: an Mg concentration of $1\times10^{17}$ cm$^{-3}$, an H concentration of $1\times10^{18}$ cm$^{-3}$, an Si concentration of $2\times10^{17}$ cm$^{-3}$, a C concentration of $7\times10^{16}$ cm$^{-3}$, and an O concentration of $7\times10^{16}$ cm$^{-3}$. However, these impurity concentrations are only examples and should not be construed as limiting. The undoped AlGaN layers may have the following impurity concentrations: an Mg concentration of $5\times10^{17}$ cm$^{-3}$ or less, an H concentration of $2\times10^{18}$ cm$^{-3}$ or less, an Si concentration of $5\times10^{17}$ cm$^{-3}$ or less, a C concentration of $3\times10^{17}$ cm$^{-3}$ or less, and an O concentration of $3\times10^{17}$ cm$^{-3}$ or less. On the other hand, the n-type AlGaN layer 3 has been doped with Si during its growth process and contains Si. The first p-type AlGaN layer 5 and the second p-type AlGaN layer 6 each have been doped with Mg during their growth process and contain Mg.

This ultraviolet light-emitting element 10 has a mesa structure 11. The mesa structure 11 has been formed by partially etching the multilayer stack 20 including the buffer layer 2, the n-type AlGaN layer 3, the light-emitting layer 4, the first p-type AlGaN layer 5, and the second p-type AlGaN layer 6 from the surface 20a of the multilayer stack 20 halfway through the n-type AlGaN layer 3. In this ultraviolet light-emitting element 10, the surface 6a of the second p-type AlGaN layer 6, the surface 20a of the multilayer stack 20, and the upper surface 11a of the mesa structure 11 are all defined by the same surface.

In this ultraviolet light-emitting element 10, the negative electrode 8 and the positive electrode 9 are arranged on one side in the thickness direction of the ultraviolet light-emitting element 10. As used herein, the "one side in the thickness direction of the ultraviolet light-emitting element 10" includes not only that portion 3aa, not covered with the light-emitting layer 4, of the surface 3a, located closer to the light-emitting layer 4, of the n-type AlGaN layer 3, but also the surface 6a of the second p-type AlGaN layer 6. In this structure, there is a level difference between the portion, covered with the light-emitting layer 4, of the surface 3a of the n-type AlGaN layer 3 and the portion 3aa not covered with the light-emitting layer 4. The negative electrode 8 is electrically connected to the n-type AlGaN layer 3. In other words, in this ultraviolet light-emitting element 10, the n-type AlGaN layer 3 to transport electrons to the light-emitting layer 4 also serves as an n-type contact layer. The positive electrode 9 is electrically connected to the second p-type AlGaN layer 6. That is to say, in this ultraviolet light-emitting element 10, the second p-type AlGaN layer 6 to transport holes to the light-emitting layer 4 also serves as a p-type contact layer.

In this ultraviolet light-emitting element 10, part of the upper surface 11a of the mesa structure 11, the side surface 11b of the mesa structure 11, and part of the portion 3aa, not covered with the light-emitting layer 4, of the surface 3a of the n-type AlGaN layer 3 are suitably covered with an electrical insulating film (not shown). An exemplary material for the electrical insulating film may be $SiO_2$.

The respective constituent members of the ultraviolet light-emitting element 10 will be described in further detail later.

In this specification, the composition ratio is a value obtained by composition analysis according to energy dispersive X-ray spectroscopy (EDX). When their magnitudes are discussed, the composition ratios do not have to be values obtained by the EDX method but may also be approximate values calculated by the Vegard's law based on lattice constants obtained by X-ray diffraction analysis or values obtained by composition analysis according to Auger electron spectroscopy. Also, in this specification, the Mg concentration depth profile is a depth profile measured by SIMS.

The ultraviolet light-emitting element 10 may be a rectangular parallelepiped light-emitting diode chip (LED chip), which is also called a "light-emitting diode die (LED die)." In this embodiment, the ultraviolet light-emitting element 10 may have a square planar shape, for example. As used herein, the "planar shape of the ultraviolet light-emitting element 10" refers to an outer peripheral shape of the ultraviolet light-emitting element 10 when viewed in the thickness direction of the ultraviolet light-emitting element 10 from either side thereof. When viewed in plan, the ultraviolet light-emitting element 10 may have a chip size of 400 µm □ (400 µm×400 µm), for example. The chip size of the ultraviolet light-emitting element 10 does not have to be 400 µm □ (400 µm×400 µm) but may also be set appropriately within the range from about 200 µm □ (200 µm×200 µm) to about 1 mm □ (1 mm×1 mm), for example. Furthermore, the planar shape of the ultraviolet light-emitting element 10 does not have to be square but may also be, for example, rectangular or any other appropriate shape.

In the ultraviolet light-emitting element 10, the well layers 41 of the light-emitting layer 4 are configured to emit an ultraviolet ray falling within the UV-C wavelength range. For example, under the classification by wavelength of an ultraviolet ray according to la Commission Internationale de l'Éclairage (CIE), the "UV-C wavelength range" is the range from 100 nm to 280 nm. In this case, in the ultraviolet light-emitting element 10, the first AlGaN layers functioning as the well layers 41 have an Al composition ratio of 0.45. That is to say, the first AlGaN layer is an $Al_{0.45}Ga_{0.55}N$ layer. Thus, the ultraviolet light-emitting element 10 has an emission peak wavelength of 275 nm. As used herein, the "emission peak wavelength" refers to a primary emission peak wavelength at room temperature (of 27° C.). Also, the "emission peak wavelength of the ultraviolet light-emitting element 10" refers herein to the emission peak wavelength of an ultraviolet ray emitted from the light-emitting layer 4 and then emanating from the ultraviolet light-emitting element 10.

In this ultraviolet light-emitting element 10, the substrate 1 supporting the multilayer stack 20 is a sapphire substrate.

One surface 1a (which may be hereinafter referred to as a "first surface 1a") of the substrate 1 is suitably a (0001) plane, i.e., a c-plane. Also, the first surface 1a of the substrate 1 suitably defines an off-axis angle of 0 degrees to 0.5 degrees, more suitably 0.05 degrees to 0.4 degrees, and even more suitably 0.1 degrees to 0.3 degrees, with respect to the (0001) plane. As used herein, the "off-axis angle" refers to a tilt angle defined by the first surface 1a with respect to the (0001) plane. Therefore, when the off-axis angle is 0 degrees, the first surface 1a is the (0001) plane. In the ultraviolet light-emitting element 10, the other second surface 1b, opposite from the first surface 1a, of the substrate 1 serves as a light extraction surface through which an ultraviolet ray is allowed to emanate. The substrate 1 suitably has a thickness within a range from about 100 μm to about 500 μm, for example. The first surface 1a of the substrate 1 does not have to be a c-plane, but may also be, for example, an m-plane, an a-plane, an R-plane, or any other appropriate plane.

In the multilayer stack 20 provided on the one surface 1a of the substrate 1, the buffer layer 2, the n-type AlGaN layer 3, the light-emitting layer 4, the first p-type AlGaN layer 5, and the second p-type AlGaN layer 6 are arranged in this order. The multilayer stack 20 may be formed by an epitaxial growth process.

In this ultraviolet light-emitting element 10, the n-type AlGaN layer 3 is formed over the one surface 1a of the substrate 1 with the buffer layer 2 interposed between them.

The buffer layer 2 is provided to improve the crystallinity of the n-type AlGaN layer 3, the light-emitting layer 4, the first p-type AlGaN layer 5, and the second p-type AlGaN layer 6. Providing the buffer layer 2 allows the ultraviolet light-emitting element 10 to reduce the density of dislocations and improve the crystallinity of the n-type AlGaN layer 3, the light-emitting layer 4, the first p-type AlGaN layer 5, and the second p-type AlGaN layer 6. This enables the ultraviolet light-emitting element 10 to improve its luminous efficacy.

The buffer layer 2 has been formed directly on the one surface 1a of the substrate 1. The buffer layer 2 is suitably configured as an AlN layer, for example.

If the buffer layer 2 thereof were too thin, the ultraviolet light-emitting element 10 would often be unable to reduce the threading dislocations sufficiently. The buffer layer 2 suitably has a dislocation density of $5\times10^9$ cm$^{-3}$ or less. On the other hand, if the buffer layer 2 thereof were too thick, there would be concern that the ultraviolet light-emitting element 10 could cause cracks due to a lattice mismatch between the buffer layer 2 and the substrate 1, peeling of the buffer layer 2 from the substrate 1, and an excessive warp of a wafer on which a plurality of ultraviolet light-emitting elements 10 are being fabricated. For these reasons, the buffer layer 2 suitably has a thickness within a range from 0.5 μm to 6 μm, for example. In the case of a sapphire substrate, the substrate 1 may be a so-called "patterned sapphire substrate (PSS)." If the substrate 1 is a PSS, then the buffer layer 2 suitably has a thickness within a range from 4 μm to 15 μm, for example.

The ultraviolet light-emitting element 10 may further include another buffer layer (hereinafter referred to as a "second buffer layer") between the buffer layer 2 (hereinafter referred to as a "first buffer layer") and the n-type AlGaN layer 3. The second buffer layer may be configured as an AlGaN layer having a larger Al composition ratio, and a smaller difference in lattice constant from the first buffer layer, than the n-type AlGaN layer 3. More specifically, the second buffer layer may be configured as an $Al_xGa_{1-x}N$ layer (where $0.85 \leq x < 1$). The second buffer layer suitably has a thickness within a range from 30 nm to 1000 nm, for example.

In the ultraviolet light-emitting element 10, the buffer layer 2 has a greater bandgap energy than any of the plurality of well layers 41 of the light-emitting layer 4. This allows the ultraviolet light-emitting element 10 to reduce the absorption, into the buffer layer 2, of an ultraviolet ray emitted from the light-emitting layer 4, and thereby improve the light extraction efficiency.

In the ultraviolet light-emitting element 10, the n-type AlGaN layer 3 serves as a layer for transporting electrons to the light-emitting layer 4. The n-type AlGaN layer 3 suitably has its Al composition ratio set to reduce absorption, into the n-type AlGaN layer 3, of an ultraviolet ray emitted from the light-emitting layer 4. For example, if the well layers 41 have an Al composition ratio of 0.45 and the barrier layers 42 have an Al composition ratio of 0.60, then the n-type AlGaN layer 3 will have an Al composition ratio of 0.60, which is equal to that of the barrier layers 42. However, this is only an example and should not be construed as limiting. The Al composition ratio of the n-type AlGaN layer 3 does not have to be equal to, but may be different from, that of the barrier layers 42.

When the well layers 41 of the light-emitting layer 4 have an Al composition ratio of 0.45, for example, the n-type AlGaN layer 3 suitably has an Al composition ratio within a range from 0.50 to 0.70. In the ultraviolet light-emitting element 10, setting the Al composition ratio of the n-type AlGaN layer 3 at a value less than 0.50 would allow the ultraviolet ray emitted from the light-emitting layer 4 to be absorbed into the n-type AlGaN layer 3 more easily, thus causing a decline in light extraction efficiency. Also, in the ultraviolet light-emitting element 10, setting the Al composition ratio of the n-type AlGaN layer 3 at a value greater than 0.70 would increase the difference in lattice constant between the n-type AlGaN layer 3 and the light-emitting layer 4 so much as to cause defects easily in the light-emitting layer 4. What is more, this would also heighten the possibility of causing an unintentional increase in contact resistance between the n-type AlGaN layer 3 and the negative electrode 8, and eventually an unwanted rise in drive voltage.

The n-type AlGaN layer 3 contains Si. The n-type AlGaN layer 3 also serves as an n-type contact layer to establish a good ohmic contact with the negative electrode 8. The n-type AlGaN layer 3 suitably has an Si concentration within a range from $5\times10^{18}$ cm$^{-3}$ to $5\times10^{19}$ cm$^{-3}$. In this ultraviolet light-emitting element 10, setting the Si concentration of the n-type AlGaN layer 3 at a value less than $5\times10^{18}$ cm$^{-3}$ would make it unable to establish an ohmic contact between the negative electrode 8 and the n-type AlGaN layer 3 or cause a decline in ohmic properties. Also, in the ultraviolet light-emitting element 10, setting the Si concentration of the n-type AlGaN layer 3 at a value greater than $5\times10^{19}$ cm$^{-3}$ would cause a deterioration in the crystallinity of the n-type AlGaN layer 3.

The n-type AlGaN layer 3 may have a thickness within a range from 1 μm to 3 μm, for example. The ultraviolet light-emitting element 10 has the mesa structure 11 described above, and includes the negative electrode 8 and the positive electrode 9 that are arranged on one side in the thickness direction of the ultraviolet light-emitting element 10. Thus, the n-type AlGaN layer 3 with a thickness less than 1 μm would have a narrower current path and require a higher drive voltage. On the other hand, in the ultraviolet light-emitting element 10, the n-type AlGaN layer 3 with a thickness greater than 3 μm would allow strain to be accumulated in itself, thus possibly producing harmful effects such as causing cracks there or an increase in the degree of warp of the substrate 1.

The n-type AlGaN layer 3 does not have to have the single-layer structure but may also have a multilayer structure including a plurality of n-type AlGaN layers with mutually different Al composition ratios.

The light-emitting layer 4 provided between the n-type AlGaN layer 3 and the second p-type AlGaN layer 6 in the thickness direction of the multilayer stack 20 is a layer that emits light (i.e., an ultraviolet ray in this case) through recombination of two types of carriers (namely, electrons and holes) injected into the well layers 41.

In the light-emitting layer 4, the plurality of barrier layers 42 and the plurality of well layers 41 are alternately arranged in the thickness direction of the multilayer stack 20. Thus, the light-emitting layer 4 has a multi-quantum well structure. In this ultraviolet light-emitting element 10, the light-emitting layer 4 includes four well layers 41 and four barrier layers 42.

Changing the Al composition ratio of the first AlGaN layers functioning as the well layers 41 allows the light-emitting layer 4 to set its emission peak wavelength at any arbitrary value within the range from 210 nm to 360 nm. The light-emitting layer 4 includes well layers 41 emitting an ultraviolet ray falling within the UV-C wavelength range. The first AlGaN layers, functioning as the well layers 41, have an Al composition ratio of 0.45 so that the emission peak wavelength of the ultraviolet light-emitting element 10 becomes 275 nm, for example. That is to say, the first AlGaN layers are $Al_{0.45}Ga_{0.55}N$ layers. On the other hand, the second AlGaN layers, functioning as the barrier layers 42, have an Al composition ratio of 0.60. That is to say, the second AlGaN layers are $Al_{0.60}Ga_{0.40}N$ layers.

The plurality of well layers 41 each suitably have a thickness within a range from 0.5 nm to 3 nm. Setting the thickness of the well layers 41 thereof at a value less than 0.5 nm would often cause a decline in the luminous efficacy of the ultraviolet light-emitting element 10. This is probably because the well layers 41 with a thickness less than 0.5 nm would weaken the carrier confinement effect achieved by confinement of carriers in the well layers 41 by the barrier layers 42 in the light-emitting layer 4. Also, setting the thickness of the well layers 41 thereof at a value greater than 3 nm would often cause a decline in the luminous efficacy of the ultraviolet light-emitting element 10. This is probably because the well layers 41 with a thickness greater than 3 nm would generate a piezoelectric field due to a lattice mismatch between the well layers 41 and the barrier layers 42 and separate electrons and holes toward both ends of each of the well layers 41 (namely, one end closer to the second p-type AlGaN layer 6 and the other end closer to the n-type AlGaN layer 3), thus causing a decline in the probability of recombination.

The plurality of barrier layers 42 each suitably have a thickness within a range from 2 nm to 20 nm. Setting the thickness of the barrier layers 42 thereof at a value less than 2 nm would often cause a decline in the luminous efficacy of the ultraviolet light-emitting element 10. This is probably because the barrier layers 42 with a thickness less than 2 nm would weaken the carrier confinement effect, achieved by confinement of carriers in the well layers 41 by the barrier layers 42, thus facilitating leakage of carriers from the well layers 41. Also, setting the thickness of the barrier layers 42 of the ultraviolet light-emitting element 10 at a value greater than 20 nm would generate concern that no carriers would be injected into the well layers 41 any longer.

The second AlGaN layers serving as the barrier layers 42 may be undoped AlGaN layers. However, this is only an example and should not be construed as limiting. The second AlGaN layers may contain Si (i.e., may be Si-doped AlGaN layers as well). In that case, the Si concentration suitably falls within the range from $5 \times 10^{17}$ $cm^{-3}$ to $5 \times 10^{18}$ $cm^{-3}$. This allows the ultraviolet light-emitting element 10 to relax the strain caused by the piezoelectric field generated due to a lattice mismatch and thereby improve its luminous efficacy. Setting the Si concentration of the barrier layers 42 at a value less than $5 \times 10^{17}$ $cm^{-3}$ would weaken the effect of relaxing the strain caused by the piezoelectric field in the ultraviolet light-emitting element 10. On the other hand, setting the Si concentration of the barrier layers 42 at a value greater than $5 \times 10^{18}$ $cm^{-3}$ would often cause a deterioration in the crystallinity of the barrier layers 42 in the ultraviolet light-emitting element 10.

The first p-type AlGaN layer 5 interposed between the light-emitting layer 4 and the second p-type AlGaN layer 6 serves as an electron blocking layer with the function of blocking electrons coming from one side, including the light-emitting layer 4, of the multilayer stack 20. In other words, the first p-type AlGaN layer 5 is a layer for substantially preventing the electrons injected from the n-type AlGaN layer 3 into the light-emitting layer 4 which have not recombined with holes in the light-emitting layer 4 from leaking (or overflowing) into the second p-type AlGaN layer 6.

The first p-type AlGaN layer 5 has been doped with Mg during its growth process and contains Mg. The first p-type AlGaN layer 5 suitably has a larger Al composition ratio than the second p-type AlGaN layer 6. The first p-type AlGaN layer 5 may have an Al composition ratio of 0.90, for example. However, this numerical value is only an example and should not be construed as limiting.

A suitable thickness for the first p-type AlGaN layer 5 varies depending on the Al composition ratio and Mg concentration of the first p-type AlGaN layer 5, and other factors, and cannot be determined unequivocally, but suitably falls within the range from 1 nm to 50 nm, and more suitably falls within the range from 5 nm to 25 nm. The first p-type AlGaN layer 5 suitably has a lower maximum Mg concentration than the second p-type AlGaN layer 6. This allows the ultraviolet light-emitting element 10 to improve the crystallinity of the first p-type AlGaN layer 5.

The first p-type AlGaN layer 5 (serving as an electron blocking layer) does not have to have a single-layer structure. Alternatively, the first p-type AlGaN layer 5 (serving as an electron blocking layer) may also have, for example, a multilayer structure in which at least two third p-type AlGaN layers, having a larger Al composition ratio than the second p-type AlGaN layer 6, and at least one fourth p-type AlGaN layer, having a smaller Al composition ratio than any of the at least two third p-type AlGaN layers and a larger Al composition ratio than the second AlGaN layers (serving as barrier layers 42), are alternately stacked upon each other. For example, the first p-type AlGaN layer 5 may have a multilayer structure in which a p-type $Al_{0.90}Ga_{0.10}N$ layer with a thickness of 7 nm (as a third p-type AlGaN layer), a p-type $Al_{0.60}Ga_{0.40}N$ layer with a thickness of 2 nm (as a fourth p-type AlGaN layer), and another p-type $Al_{0.90}Ga_{0.10}N$ layer with a thickness of 7 nm (as a third p-type AlGaN layer) are stacked in this order over the light-emitting layer 4.

The second p-type AlGaN layer 6 is a layer for transporting holes to the light-emitting layer 4. The second p-type AlGaN layer 6 also serves as a p-type contact layer to establish a good ohmic contact with the positive electrode 9.

The second p-type AlGaN layer 6 has been doped with Mg during its growth process and contains Mg. Setting the Al composition ratio of the second p-type AlGaN layer 6 is suitably done to reduce the absorption, into the second p-type AlGaN layer 6, of the ultraviolet ray emitted from the light-emitting layer 4. In this case, the second p-type AlGaN layer 6 suitably has a larger Al composition ratio than any of the well layers 41 (first AlGaN layers) and a smaller Al composition ratio than the first p-type AlGaN layer 5. For example, if the well layers 41 (first AlGaN layers) each have an Al composition ratio of 0.45 and the barrier layers 42 (second AlGaN layers) each have an Al composition ratio of 0.60, then the second p-type AlGaN layer 6 suitably has an Al composition ratio of 0.60, for example. That is to say, if each of the well layers 41 (first AlGaN layers) is configured as an $Al_{0.45}Ga_{0.55}N$ layer, then the second p-type AlGaN layer 6 is suitably a p-type $Al_{0.60}Ga_{0.40}N$ layer.

To reduce the drive voltage of the ultraviolet light-emitting element 10, the thickness of the second p-type AlGaN layer 6 is suitably equal to or less than 300 nm, more suitably 200 nm or less. Also, to reduce the in-plane variation of the electrical characteristic of the second p-type AlGaN layer 6, the thickness of the second p-type AlGaN layer 6 is suitably equal to or greater than 20 nm, more suitably 30 nm or more.

In the thickness direction of the ultraviolet light-emitting element 10, the maximum Mg concentration of the second p-type AlGaN layer 6 is higher than the maximum Mg concentration of the first p-type AlGaN layer 5 (electron blocking layer). In other words, in this ultraviolet light-emitting element 10, the maximum Mg concentration of the first p-type AlGaN layer 5 is lower than the maximum Mg concentration of the second p-type AlGaN layer 6. This allows the ultraviolet light-emitting element 10 to suppress the diffusion of Mg from the first p-type AlGaN layer 5 toward the light-emitting layer 4, thus reducing the occurrence of defects in the light-emitting layer 4.

Figure 2:
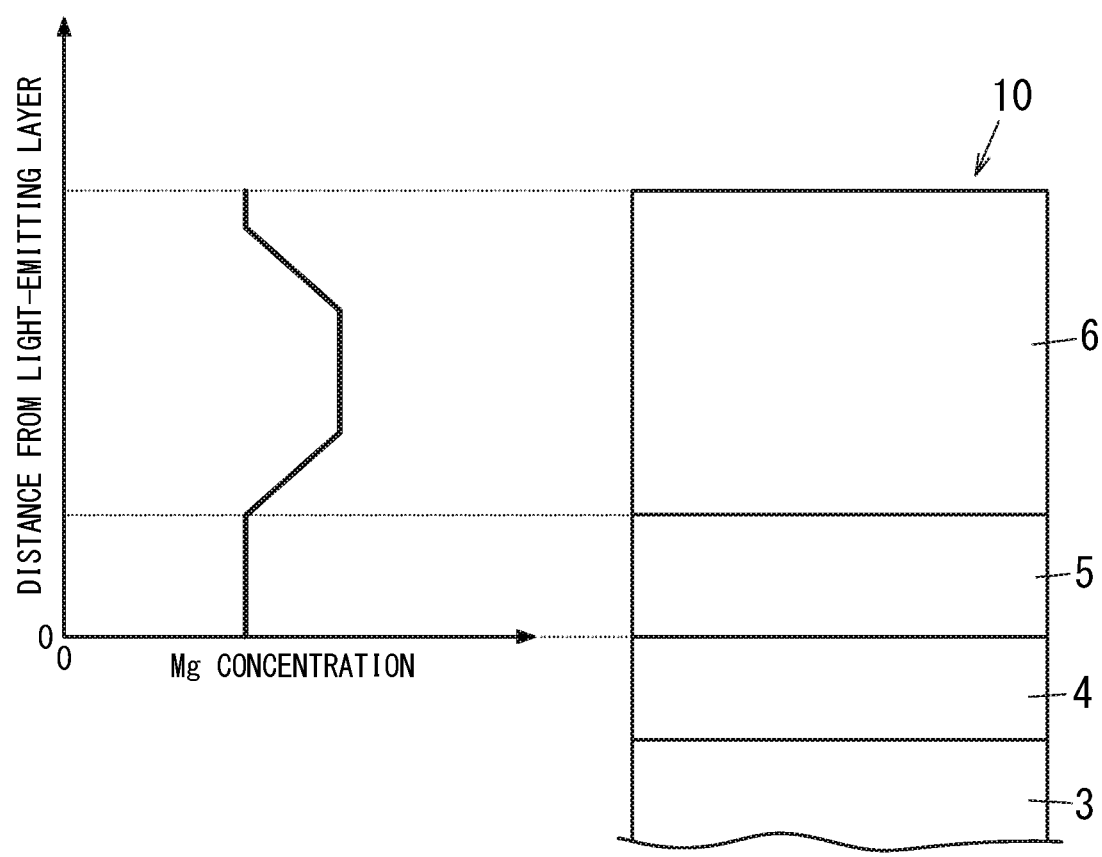
FIG. 2 schematically illustrates an Mg concentration profile in a thickness direction of the ultraviolet light-emitting element according to the embodiment of the present invention.

As shown in FIG. 2, the second p-type AlGaN layer 6 includes a region where the concentration of Mg increases in the thickness direction of the second p-type AlGaN layer 6 as the distance from the first p-type AlGaN layer 5 increases in the thickness direction. FIG. 2 schematically illustrates an Mg concentration profile in the thickness direction of the ultraviolet light-emitting element 10, corresponding to an Mg concentration depth profile measured by SIMS. In FIG. 2, the abscissa indicates the Mg concentration, and the ordinate indicates the distance from the light-emitting layer 4 (i.e., the distance from the light-emitting layer 4 in the thickness direction of the ultraviolet light-emitting element 10). Thus, when viewed from a point most distant from the light-emitting layer 4 as a reference point, FIG. 2 corresponds to the Mg concentration depth profile. In the ultraviolet light-emitting element 10, the Mg concentration reaches a local maximum halfway in the thickness direction of the second p-type AlGaN layer 6 as shown in FIG. 2. The local maximum of the Mg concentration is suitably equal to or greater than $1\times10^{20}$ cm$^{-3}$ and less than $6\times10^{20}$ cm$^{-3}$. Setting the local maximum Mg concentration of the second p-type AlGaN layer 6 at a value less than $1\times10^{20}$ cm$^{-3}$ would often cause a decrease in the luminous efficacy of the ultraviolet light-emitting element 10. This is probably because of a decline in the injectability of holes into the second p-type AlGaN layer 6. On the other hand, setting the local maximum Mg concentration of the second p-type AlGaN layer 6 at a value less than $1\times10^{20}$ cm$^{-3}$ would cause the ultraviolet light-emitting element 10 to either fail to establish an ohmic contact, or have increased contact resistance, between the positive electrode 9 and the second p-type AlGaN layer 6. Furthermore, setting the local maximum Mg concentration of the second p-type AlGaN layer 6 at a value equal to or greater than $6\times10^{20}$ cm$^{-3}$ would often cause a deterioration in the crystallinity of the second p-type AlGaN layer 6 in the ultraviolet light-emitting element 10.

In the Mg concentration profile in the thickness direction of the second p-type AlGaN layer 6, the local maximum Mg concentration is suitably higher than $3\times10^{20}$ cm$^{-3}$ and lower than $6\times10^{20}$ cm$^{-3}$. In FIG. 2, the local maximum Mg concentration is equal to the maximum Mg concentration.

The present inventors made, as evaluation samples, a plurality of reference ultraviolet light-emitting elements, each having the same configuration as the ultraviolet light-emitting element 10, while developing the ultraviolet light-emitting element 10, and carried out a high temperature continuity test (accelerated test). The reference ultraviolet light-emitting elements each had the same basic configuration as the ultraviolet light-emitting element 10 of this embodiment, but their p-type contact layer, configured as a p-type AlGaN layer, had a constant Mg concentration of $1\times10^{20}$ cm$^{-3}$ in the thickness direction thereof, which is a major difference from the ultraviolet light-emitting element 10 of this embodiment. In the high temperature continuity test, the temperature was set at 100° C. and the continuous current was set at 30 mA. Also, in the high temperature continuity test, the optical output powers of the reference ultraviolet light-emitting elements were measured with an integrating sphere and a spectroscope. As a result, the present inventors discovered that most of the evaluation samples had optical output powers steeply decreased in a few hours even when supplied with a continuous current.

In contrast, the second p-type AlGaN layer 6 of the ultraviolet light-emitting element 10 does not have a constant Mg concentration in the thickness direction of the second p-type AlGaN layer 6 but includes a region where the Mg concentration increases as the distance from the first p-type AlGaN layer 5 increases. This allows the ultraviolet light-emitting element 10 to curb the deterioration in crystallinity and enhance its optical output power while attempting to improve the conductivity of the second p-type AlGaN layer 6. As far as the second p-type AlGaN layer 6 is concerned, in the region where the Mg concentration increases in the thickness direction of the second p-type AlGaN layer 6 as the distance from the first p-type AlGaN layer 5 increases in the thickness direction, the Mg concentration increases gradually with the increasing distance from the first p-type AlGaN layer 5. However, this is only an example and should not be construed as limiting. Alternatively, the Mg concentration may also increase stepwise, for example.

The negative electrode 8 is a contact electrode provided on the portion 3aa, not covered with the light-emitting layer 4, of the surface 3a of the n-type AlGaN layer 3. The negative electrode 8 suitably makes an ohmic contact with the n-type AlGaN layer 3. The negative electrode 8 may be formed by, for example, forming a multilayer film of a first Ti layer, an Al layer, a second Ti layer, and an Au layer (which may be hereinafter referred to as a "first multilayer film") on the portion 3aa of the n-type AlGaN layer 3 and then subjecting the first multilayer film to an annealing process. For example, the thicknesses of the first Ti layer, Al layer, second Ti layer, and Au layer of the first multilayer film may be 20 nm, 50 nm, 20 nm, and 100 nm, respectively.

The positive electrode 9 is a contact electrode provided on the surface 6a of the second p-type AlGaN layer 6. The positive electrode 9 suitably makes an ohmic contact with the second p-type AlGaN layer 6. The positive electrode 9 may be formed by, for example, forming a multilayer film of an Ni layer and an Au layer (which may be hereinafter referred to as a "second multilayer film") on the surface 6a of the second p-type AlGaN layer 6 and then subjecting the second multilayer film to an annealing process. For example, the thicknesses of the Ni layer and Au layer of the second multilayer film may be 20 nm and 150 nm, respectively.

The ultraviolet light-emitting element 10 suitably includes a first pad electrode on the negative electrode 8. The first pad electrode is an external connection electrode. The first pad electrode may be a multilayer film including a Ti film on the negative electrode 8 and an Au film on the Ti film, for example. The first pad electrode is electrically connected to the negative electrode 8. The first pad electrode suitably covers the negative electrode 8.

The ultraviolet light-emitting element 10 suitably further includes a second pad electrode on the positive electrode 9. The second pad electrode is an external connection electrode. The second pad electrode may be a multilayer film including a Ti film on the positive electrode 9 and an Au film on the Ti film, for example. The second pad electrode is electrically connected to the positive electrode 9. The second pad electrode suitably covers the positive electrode 9.

The ultraviolet light-emitting element 10 does not have to be configured to emit an ultraviolet ray falling within the UV-C wavelength range but may also be configured to emit an ultraviolet ray falling within the UV-B wavelength range, for example. For example, under the classification by wavelength of an ultraviolet ray according to la Commission Internationale de l'Éclairage, the "UV-B wavelength range" is the range from 280 nm to 315 nm.

A method for fabricating the ultraviolet light-emitting element 10 will be described briefly.

First, according to this method for fabricating the ultraviolet light-emitting element 10, a wafer (which may be a sapphire wafer) to be diced into respective substrates 1 for a plurality of ultraviolet light-emitting elements 10 is provided.

Next, according to the method for fabricating the ultraviolet light-emitting element 10, after the wafer has been provided, the wafer is subjected to pretreatment, loaded into an epitaxial growth system, and then a multilayer stack 20 is formed by epitaxial growth process on a first surface of the wafer. The first surface of the wafer is a surface corresponding to the first surface 1a of the substrate 1. If an MOVPE system is adopted as the epitaxial growth system, trimethylaluminum (TMAl) is suitably used as an Al source gas, trimethylgallium (TMGa) is suitably used as a Ga source gas, and $NH_3$ is suitably used as an N source gas. As a source gas for Si, which is a dopant imparting n-type conductivity, tetraethylsilane (TESi) is suitably used. As a source gas for Mg, which is a dopant imparting p-type conductivity, bis(cyclopentadienyl)magnesium ($Cp_2Mg$) is suitably used. A carrier gas for the respective source gases is suitably an $H_2$ gas, an $N_2$ gas, or a mixture of an $H_2$ gas and an $N_2$ gas, for example. The source gases are not particularly limited to the ones exemplified above. Alternatively, triethylgallium (TEGa) may also be used as a Ga source gas, a hydrazine derivative may also be used as an N source gas, and monosilane ($SiH_4$) may also be used as an Si source gas, for example. As for conditions for growing the multilayer stack 20, substrate temperature, VIII ratio, flow rates of the respective source gases, growth pressures, and other parameters may be set appropriately for the buffer layer 2, n-type AlGaN layer 3, barrier layers 42 (second AlGaN layers), well layers 41 (first AlGaN layers), first p-type AlGaN layer 5, and second p-type AlGaN layer 6. The "substrate temperature" refers herein to the temperature of the wafer. When an MOVPE system is used as an epitaxial growth system, the "substrate temperature" may be replaced with the temperature of a susceptor supporting the wafer. For example, the substrate temperature may be replaced with the temperature of the susceptor measured with a thermocouple. The "V/III ratio" refers herein to the ratio of the molar flow rate [μmol/min] of a source gas of N as a group V element to the total molar flow rate [μmol/min] of respective source gases of group III elements (such as an Al source gas, a Ga source gas, and an In source gas). The "growth pressure" refers herein to the pressure in the reaction furnace in a state where the respective source gases and carrier gases are being supplied into the reaction furnace of the MOVPE system.

Subsequently, according to the method for fabricating the ultraviolet light-emitting element 10, after the multilayer stack 20 has been formed on the first surface of the wafer, the wafer with the multilayer stack 20 is unloaded from the epitaxial growth system. Such an assembly including at least the wafer and the multilayer stack 20 will be hereinafter referred to as an "epitaxial wafer."

Thereafter, according to the method for fabricating the ultraviolet light-emitting element 10, the epitaxial wafer unloaded from the epitaxial growth system is loaded into an annealing system, and annealed in order to activate the p-type dopant in the first p-type AlGaN layer 5 and the second p-type AlGaN layer 6. As the annealing system for annealing the epitaxial wafer, a lamp annealing system or an electric furnace annealing system may be used, for example. The p-type dopant refers herein to an acceptor dopant and may be Mg, for example.

Next, according to the method for fabricating the ultraviolet light-emitting element 10, the epitaxial wafer is unloaded from the annealing system, and then the mesa structure 11 is formed by, for example, photolithography and etching techniques.

Then, according to the method for fabricating the ultraviolet light-emitting element 10, after the mesa structure 11 has been formed, the electrical insulating film mentioned above is formed. The electric insulating film may be formed by a thin film deposition technique such as a chemical vapor deposition (CVD) process and photolithography and etching techniques, for example.

Subsequently, according to the method for fabricating the ultraviolet light-emitting element 10, after the electrical insulating film has been formed, the negative electrode 8 is formed. To form the negative electrode 8, first of all, a first resist layer, which has been patterned so as to expose only a region where the negative electrode 8 will be formed, is formed on the surface of the epitaxial wafer. Thereafter, a first multilayer film with a multilayer structure, in which a first Ti layer, an Al layer, a second Ti layer, and an Au layer are stacked in this order to thicknesses of 20 nm, 50 nm, 20 nm, and 100 nm, respectively, for example, is formed by an evaporation process. After the first multilayer film has been formed, the first resist layer and excessive portions of the films on the first resist layer (i.e., portions of the first multilayer film on the first resist layer) are removed by being lifted off, thereby patterning the first multilayer film. Thereafter, an annealing process is conducted. The annealing process is a process for turning the contact between the negative electrode 8 and the n-type AlGaN layer 3 into an ohmic contact. The multilayer structure of the first multilayer film and the thicknesses of the respective films are only exemplary ones and should not be construed as limiting. The annealing process is suitably a rapid thermal annealing (RTA) to be conducted within an $N_2$ gas atmosphere. The RTA process may be conducted at an annealing temperature of 700° C. for an annealing duration of one minute, for example. However, these numerical values are only exemplary ones and should not be construed as limiting.

Next, according to the method for fabricating the ultraviolet light-emitting element 10, after the negative electrode 8 has been formed, the positive electrode 9 is formed. To form the positive electrode 9, first of all, a second resist layer, which has been patterned so as to expose only a region where the positive electrode 9 will be formed, is formed on the surface of the epitaxial wafer. Thereafter, a second multilayer film with a multilayer structure, in which an Ni layer and an Au layer are stacked in this order to thicknesses of 20 nm and 150 nm, respectively, for example, is formed by an electron beam evaporation process. After that, the second resist layer and excessive portions of the films on the second resist layer (i.e., portions of the second multilayer film on the second resist layer) are removed by being lifted off. Thereafter, an RTA process is conducted within an $N_2$ gas atmosphere to turn the contact between the positive electrode 9 and the second p-type AlGaN layer 6 into an ohmic contact. The multilayer structure of the second multilayer film and the thicknesses of the respective films are only exemplary ones and should not be construed as limiting. The RTA process may be conducted at an annealing temperature of 500° C. for an annealing duration of 15 minutes, for example. However, these numerical values are only exemplary ones and should not be construed as limiting.

The first pad electrode and the second pad electrode may be formed by a lift-off process using photolithography and thin film deposition techniques, for example.

According to this method for fabricating the ultraviolet light-emitting element 10, an epitaxial wafer, on which a plurality of ultraviolet light-emitting elements 10 have been formed, may be obtained.

In addition, according to the method for fabricating the ultraviolet light-emitting element 10, cutting off a single epitaxial wafer with a dicing saw, for example, allows a plurality of ultraviolet light-emitting elements 10 to be obtained out of the single epitaxial wafer. Also, according to the method for fabricating the ultraviolet light-emitting element 10, before the epitaxial wafer is cut off, the wafer suitably has its second surface, opposite from the first surface thereof, polished so that the thickness of the wafer is adjusted to the desired thickness of the substrate 1. Such a method for fabricating the ultraviolet light-emitting element 10 contributes to increasing the manufacturing yield.

An ultraviolet light-emitting element 10 will be described as a specific example.

The substrate 1 of the ultraviolet light-emitting element 10 according to the specific example is a sapphire substrate. One surface 1a of the substrate 1 is a (0001) plane.

The buffer layer 2 is an AlN layer with a thickness of 4 µm.

The n-type AlGaN layer 3 is an n-type $Al_{0.60}Ga_{0.40}N$ layer with a thickness of 2 µm.

The well layers 41 (first AlGaN layers) of the light-emitting layer 4 are $Al_{0.45}Ga_{0.55}N$ layers each having a thickness of 2 nm. The barrier layers 42 (second AlGaN layers) of the light-emitting layer 4 are $Al_{0.60}Ga_{0.40}N$ layers each having a thickness of 10 nm. The light-emitting layer 4 includes four well layers 41 and four barrier layers 42.

The first p-type AlGaN layer 5 (electron blocking layer) has a triple layer structure in which a p-type $Al_{0.90}Ga_{0.10}N$ layer with a thickness of 7 nm, a p-type $Al_{0.60}Ga_{0.40}N$ layer with a thickness of 2 nm, and another p-type $Al_{0.90}Ga_{0.10}N$ layer with a thickness of 7 nm are stacked in this order over the light-emitting layer 4. The first p-type AlGaN layer 5 has a maximum Mg concentration of $2 \times 10^{20}$ cm$^{-3}$ in the thickness direction thereof.

The second p-type AlGaN layer 6 is a p-type $Al_{0.60}Ga_{0.40}N$ layer with a thickness of 50 nm. The second p-type AlGaN layer 6 has a maximum Mg concentration of $5 \times 10^{20}$ cm$^{-3}$ in the thickness direction thereof.

In a method for fabricating the ultraviolet light-emitting element 10 according to the specific example, the multilayer stack 20 was epitaxially grown in a reaction furnace of an MOVPE system.

As source gases for growing the buffer layer 2, TMAl and $NH_3$ were used with the substrate temperature set at 1300° C.

As source gases for growing the n-type AlGaN layer 3, TMAl, TMGa, $NH_3$, and TESi were used with the substrate temperature set at 1100° C.

As source gases for growing the light-emitting layer 4, TMAl, TMGa, and $NH_3$ were used with the substrate temperature set at 1100° C.

As source gases for growing the first p-type AlGaN layer 5, TMAl, TMGa, $NH_3$, and $Cp_2Mg$ were used with the substrate temperature set at 1100° C.

As source gases for growing the second p-type AlGaN layer 6, TMAl, TMGa, $NH_3$, and $Cp_2Mg$ were used with the substrate temperature set at 1100° C.

Figure 3:
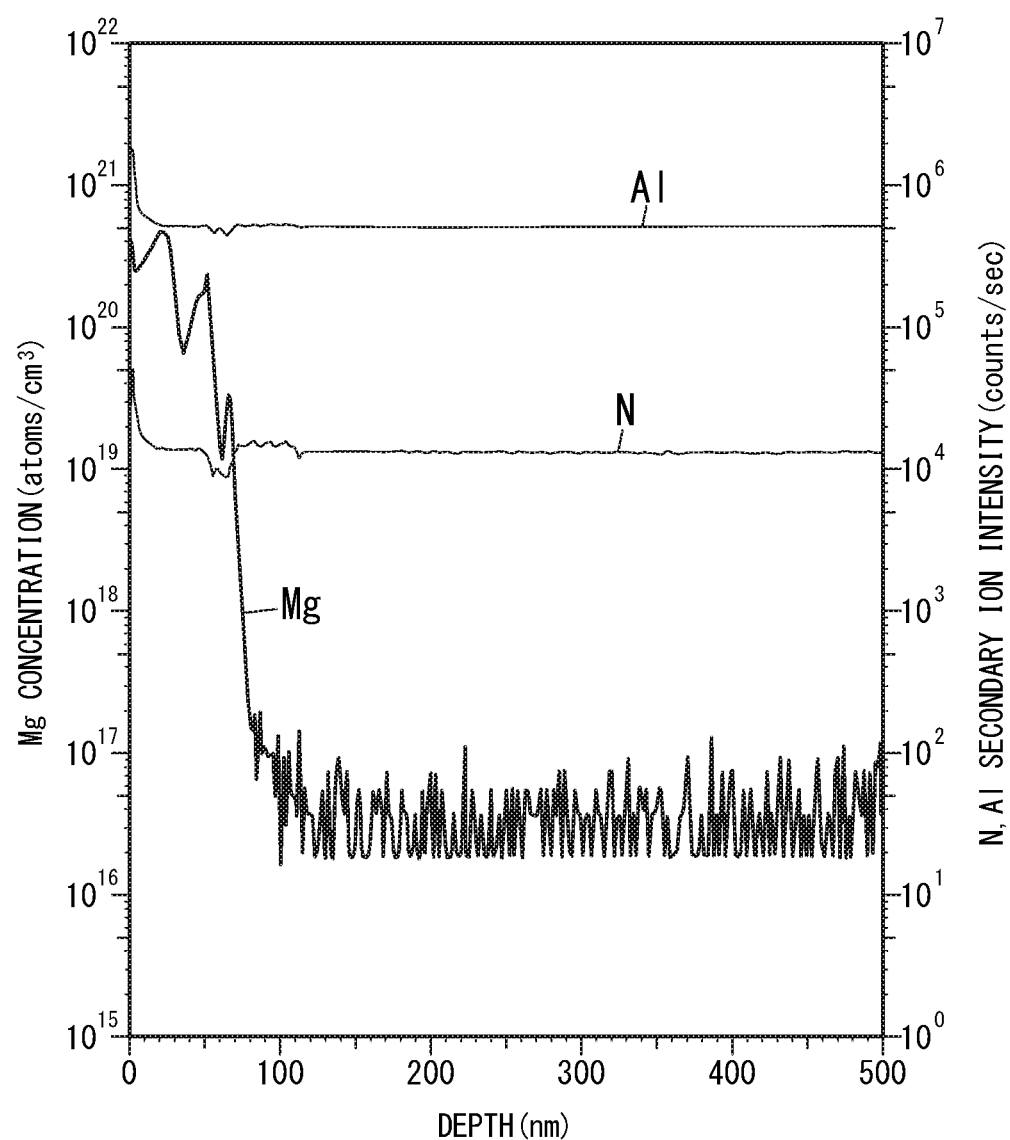
FIG. 3 shows the Mg concentration profile in the thickness direction of an ultraviolet light-emitting element according to a specific example.

FIG. 3 shows the Mg concentration profile in the thickness direction of the ultraviolet light-emitting element 10 according to the specific example. More specifically, shown in FIG. 3 is the Mg concentration profile, which was measured by SIMS in the depth direction from the surface 6a of the second p-type AlGaN layer 6 for the ultraviolet light-emitting element 10 according to the specific example. In FIG. 3, the abscissa indicates the depth as measured from the surface 6a of the second p-type AlGaN layer 6, the ordinate on the left axis indicates the Mg concentration, and the ordinate on the right axis indicates the secondary ion intensity. That is to say, FIG. 3 is graph showing an Mg concentration profile after quantification standardization has been carried out on standard samples and also showing depth profiles of Al and N secondary ion intensities. As for the notation of concentrations, "atoms/cm$^3$" is synonymous with "cm$^{-3}$."

The present inventors confirmed, by the results of measurement of the Mg concentration depth profile by SIMS, that diffusion of Mg from the first p-type AlGaN layer 5 toward the light-emitting layer 4 was suppressed in the ultraviolet light-emitting element 10. Setting the maximum Mg concentration of the first p-type AlGaN layer 5 at a value lower than the maximum concentration of the second p-type AlGaN layer 6 allows the ultraviolet light-emitting element 10 to suppress the diffusion of Mg from the first p-type AlGaN layer 5 toward the light-emitting layer 4 and thereby reduce the occurrence of defects in the light-emitting layer 4. This would allow the ultraviolet light-emitting element 10 to have a longer life.

The following Table 1 summarizes the relationship between the maximum Mg concentration in the thickness direction of the second p-type AlGaN layer 6 and characteristics of the ultraviolet light-emitting element 10 (such as its optical output power, drive voltage, and optical output maintenance factor).

TABLE 1

| Maximum Mg concentration [cm$^{-3}$] | Optical output [mW] | Drive voltage [V] | Optical output maintenance factor [%] |
|---|---|---|---|
| 1 × 10$^{20}$ | 3.4 | 20.1 | 0 |
|  | 3.9 | 21.4 | 0 |
|  | 3.8 | 20.9 | 0 |
|  | 3.3 | 21.5 | 0 |
|  | 3.6 | 21.2 | 0 |
|  | 4.2 | 19.9 | 0 |
|  | 4.0 | 21.0 | 0 |
|  | 4.3 | 21.9 | 0 |
|  | 3.9 | 20.5 | 0 |
|  | 4.0 | 21.0 | 0 |
|  | 3.5 | 20.3 | 0 |
|  | 3.8 | 21.3 | 0 |
|  | 3.5 | 21.9 | 0 |
|  | 4.0 | 21.4 | 0 |
|  | 3.3 | 20.8 | 0 |
| 2 × 10$^{20}$ | 3.1 | 21.9 | 0 |
|  | 4.1 | 20.2 | 0 |
| 3 × 10$^{20}$ | 3.7 | 18.1 | 0 |
| 5 × 10$^{20}$ | 3.4 | 16.1 | 84.7 |
|  | 3.7 | 16.8 | 85.0 |
|  | 3.3 | 16.8 | 71.5 |
|  | 3.0 | 18.1 | 65.0 |
|  | 3.4 | 17.7 | 77.0 |
|  | 3.7 | 18.4 | 98.4 |
|  | 2.7 | 17.2 | 57.4 |
|  | 3.3 | 16.6 | 0 |
|  | 3.1 | 16.5 | 81.7 |
| 6 × 10$^{20}$ | 3.2 | 117.2 | 0 |

In Table 1, the "optical output" is the optical output power of the ultraviolet light-emitting element 10 when the ultraviolet light-emitting element 10 is supplied with a constant current of 20 mA, and is a value measured with an integrating sphere and a spectroscope. Also, in Table 1, the "drive voltage" is a forward voltage drop (Vf) to be caused when the ultraviolet light-emitting element 10 is supplied with a constant current of 20 mA for 5 msec. Furthermore, in Table 1, the "optical output maintenance factor" is the ratio of the optical output power of the ultraviolet light-emitting element 10 that has been continuously supplied with a current for 24 hours to the initial value of the optical output thereof when the ultraviolet light-emitting element 10 is subjected to the high temperature continuity test. In the high temperature continuity test, the temperature was set at 100° C., the continuous current was 30 mA, and the optical output power of the ultraviolet light-emitting element 10 was measured with an integrating sphere and a spectroscope. The higher the optical output maintenance factor is, the longer the life of the ultraviolet light-emitting element 10 would be. As used herein, the "life" may be defined as the amount of time it takes for the optical output power to decrease from its initial value to 70% of the initial value when the ultraviolet light-emitting element 10 is subjected to a high temperature continuity test (accelerated test) at a temperature of 100° C. and a current of 30 mA.

As can be seen from Table 1, when the maximum Mg concentration in the thickness direction of the second p-type AlGaN layer 6 was 1×10$^{20}$ cm$^{-3}$ the average optical output power and average drive voltage of the fifteen samples were about 3.8 mW and about 21.0 V, respectively. On the other hand, when the maximum Mg concentration in the thickness direction of the second p-type AlGaN layer 6 was 5×10$^{20}$ cm$^{-3}$, the average optical output power and average drive voltage of the nine samples were about 3.3 mW and about 17.1 V, respectively. Thus, it can be seen that setting the maximum Mg concentration in the thickness direction of the second p-type AlGaN layer 6 at 5×10$^{20}$ cm$^{-3}$ allows the drive voltage to be reduced, compared to setting the maximum Mg concentration at 1×10$^{20}$ cm$^{-3}$. In addition, it can also be seen from Table 1 that from the standpoint of extending the life of the ultraviolet light-emitting element 10, the maximum Mg concentration in the thickness direction of the second p-type AlGaN layer 6 is suitably higher than 3×10$^{20}$ cm$^{-3}$ and lower than 6×10$^{20}$ cm$^{-3}$. In this case, when the maximum Mg concentration of the second p-type AlGaN layer 6 is lower than 5×10$^{20}$ cm$^{-3}$, the ultraviolet light-emitting element 10 would have a high drive voltage and a shorter life. On the other hand, when the maximum Mg concentration of the second p-type AlGaN layer 6 is higher than 5×10$^{20}$ cm$^{-3}$, the crystallinity of the second p-type AlGaN layer 6 would deteriorate, which shortens the life of the ultraviolet light-emitting element 10.

An ultraviolet light-emitting element 10 according to an exemplary embodiment includes: a multilayer stack 20 in which an n-type AlGaN layer 3, a light-emitting layer 4, a first p-type AlGaN layer 5, and a second p-type AlGaN layer 6 are arranged in this order; a negative electrode 8 provided directly on a portion 3aa of one surface 3a of the n-type AlGaN layer 3, the portion 3aa being not covered with the light-emitting layer 4, the one surface 3a being located closer to the light-emitting layer 4; and a positive electrode 9 provided directly on a surface 6a of the second p-type AlGaN layer 6. The light-emitting layer 4 has a multi-quantum well structure in which a plurality of barrier layers 42 and a plurality of well layers 41 are alternately arranged. Each of the plurality of well layers 41 is configured as a first AlGaN layer. Each of the plurality of barrier layers 42 is configured as a second AlGaN layer having a larger Al composition ratio than the first AlGaN layer (well layer 41). The n-type AlGaN layer 3 has a larger Al composition ratio than the first AlGaN layer (well layer 41). The first p-type AlGaN layer 5 has a larger Al composition ratio than the first AlGaN layer (well layer 41). The second p-type AlGaN layer 6 has a larger Al composition ratio than the first AlGaN layer (well layer 41). The first p-type AlGaN layer 5 and the second p-type AlGaN layer 6 both contain Mg. The second p-type AlGaN layer 6 has a higher maximum Mg concentration than the first p-type AlGaN layer 5. The second p-type AlGaN layer 6 includes a region where an Mg concentration increases in a thickness direction of the second p-type AlGaN layer 6 as a distance from the first p-type AlGaN layer 5 increases in the thickness direction. This allows the ultraviolet light-emitting element 10 to have a longer life. In the ultraviolet light-emitting element 10, the second p-type AlGaN layer 6 has a higher maximum Mg concentration than the first p-type AlGaN layer 5. The second p-type AlGaN layer 6 includes a region where an Mg concentration increases as the distance from the first p-type AlGaN layer 5 increases. This allows the ultraviolet light-emitting element 10 to reduce the contact resistance between the second p-type AlGaN layer 6 and the positive electrode 9. Also, in this ultraviolet light-emitting element 10, the maximum Mg concentration of the first p-type AlGaN layer 5 is lower than the maximum Mg concentration of the second p-type AlGaN layer 6, thus allowing diffusion of Mg from the first p-type AlGaN layer 5 toward the light-emitting layer 4 to be suppressed. These would allow the ultraviolet light-emitting element 10 to have a longer life.

Figure 4:
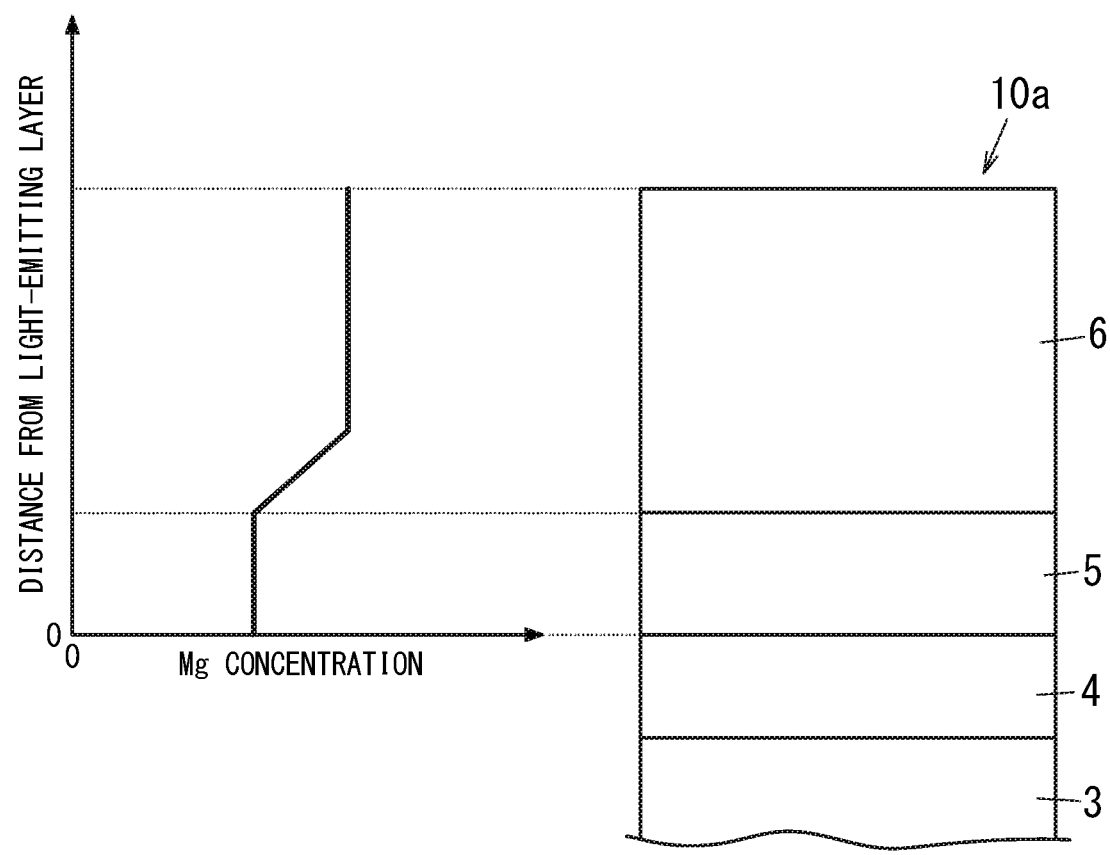
FIG. 4 schematically illustrates an Mg concentration profile in a thickness direction of an ultraviolet light-emitting element according to a first variation of the embodiment of the present invention.

In the ultraviolet light-emitting element 10, the Mg concentration suitably reaches a local maximum halfway in the thickness direction of the second p-type AlGaN layer 6. This allows the ultraviolet light-emitting element 10 to have a longer life. In this case, having the Mg concentration reach a local maximum halfway in the thickness direction of the second p-type AlGaN layer 6 allows the ultraviolet light-emitting element 10 to improve the crystallinity of the second p-type AlGaN layer 6 and thereby extend its life, compared to a situation where the Mg concentration is allowed to increase continuously from the interface between the first p-type AlGaN layer 5 and the second p-type AlGaN layer 6 through the surface 6a of the second p-type AlGaN layer 6. FIG. 4 schematically illustrates an Mg concentration profile in a thickness direction of an ultraviolet light-emitting element 10a according to a first variation of the exemplary embodiment. FIG. 4 may be read in the same way as in FIG. 2. The ultraviolet light-emitting element 10a according to the first variation has the same configuration as, but just has a different Mg concentration profile from, the ultraviolet light-emitting element 10 according to the exemplary embodiment. That is to say, in the ultraviolet light-emitting element 10a according to the first variation, the second p-type AlGaN layer 6 also includes a region where the Mg concentration increases in the thickness direction of the second p-type AlGaN layer 6 as the distance from the first p-type AlGaN layer 5 increases in the thickness direction. The crystallinity of the second p-type AlGaN layer 6 may be evaluated with a cross-sectional transmission electron microscope (TEM) image, for example.

In the ultraviolet light-emitting element 10, in an Mg concentration profile in the thickness direction of the second p-type AlGaN layer 6, the Mg concentration suitably has a local maximum higher than $3 \times 10^{20}$ cm$^{-3}$ and lower than $6 \times 10^{20}$ cm$^{-3}$. This allows the ultraviolet light-emitting element 10 to have an even longer life.

The ultraviolet light-emitting element 10 suitably includes a substrate 1 configured to support the multilayer stack 20 thereon. The multilayer stack 20 is provided on one surface 1a of the substrate 1. The n-type AlGaN layer 3, the light-emitting layer 4, the first p-type AlGaN layer 5, and the second p-type AlGaN layer 6 are arranged in this order with respect to the one surface 1a. This allows the ultraviolet light-emitting element 10 to reduce the warp of the multilayer stack 20. The substrate 1 is a single crystal substrate, which may be a sapphire substrate, for example. The single crystal substrate does not have to be a sapphire substrate but may also be an SiC substrate, an AlN substrate, or any other appropriate substrate. This allows the ultraviolet light-emitting element 10 to let an ultraviolet ray, emitted from the light-emitting layer 4, emanate through the second surface 1b of the substrate 1.

In the ultraviolet light-emitting element 10, the light-emitting layer 4 is suitably configured to emit an ultraviolet ray falling within either a UV-C wavelength range or a UV-B wavelength range. This allows the ultraviolet light-emitting element 10 to be used in various fields of application including high-efficiency white light sources, disinfection, medicine, and high speed processing of environmental contaminants, to name just a few. When the ultraviolet light-emitting element 10 is used in the field of disinfection, the well layers 41 in the light-emitting layer 4 suitably have a UV emission peak wavelength falling within an ultraviolet wavelength range from 260 nm to 285 nm. This allows the ultraviolet light-emitting element 10 to emit an ultraviolet ray with a wavelength falling within the range from 260 nm to 285 nm, which is easily absorbed into viruses or bacteria DNAs, thus achieving efficient disinfection.

Figure 5:
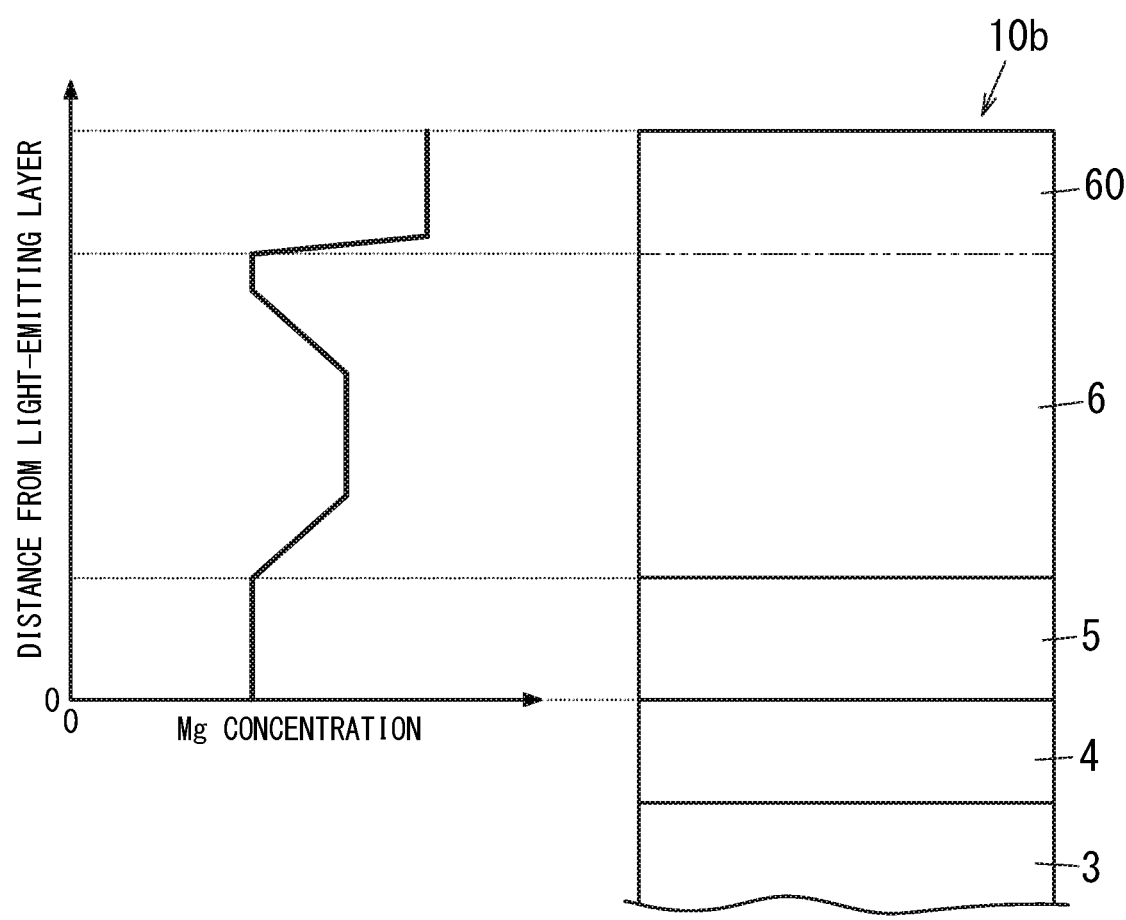
FIG. 5 schematically illustrates an Mg concentration profile in a thickness direction of an ultraviolet light-emitting element according to a second variation of the embodiment of the present invention.

FIG. 5 schematically illustrates an Mg concentration profile in a thickness direction of an ultraviolet light-emitting element 10b according to a second variation of the exemplary embodiment. FIG. 5 may be read in the same way as in FIG. 2. The ultraviolet light-emitting element 10b according to the second variation has the same configuration as, but just has a different Mg concentration profile from, the ultraviolet light-emitting element 10 according to the exemplary embodiment. Specifically, in the ultraviolet light-emitting element 10b, a surface region 60, which is a region located closest to the positive electrode 9 (see FIG. 1), of the second p-type AlGaN layer 6 may have an Mg concentration higher than a local maximum Mg concentration in the Mg concentration profile in the thickness direction of the second p-type AlGaN layer 6. This allows the ultraviolet light-emitting element 10b according to the second variation to further reduce the contact resistance between the second p-type AlGaN layer 6 and the positive electrode 9 (see FIG. 1), compared to the ultraviolet light-emitting element 10 according to the exemplary embodiment and the ultraviolet light-emitting element 10a according to the first variation.

In the ultraviolet light-emitting element 10b according to the second variation, the surface region 60 suitably has a thickness within a range from 1 nm to 10 nm. This allows the ultraviolet light-emitting element 10b to enhance its optical output power while curbing a deterioration in the crystallinity of the second p-type AlGaN layer 6.

In the ultraviolet light-emitting element 10b according to the second variation, in the concentration profile, the surface region 60 suitably has a maximum Mg concentration within a range from $6 \times 10^{20}$ cm$^{-3}$ to $8 \times 10^{20}$ cm$^{-3}$. This allows the ultraviolet light-emitting element 10b to further reduce the contact resistance between the second p-type AlGaN layer 6 and the positive electrode 9 (see FIG. 1).

In the ultraviolet light-emitting elements 10, 10a, and 10b, the Al composition ratio of the second p-type AlGaN layer 6 may increase as the Mg concentration increases in the thickness direction of the second p-type AlGaN layer 6, as further illustrated in FIG. 2. This allows the ultraviolet light-emitting elements 10, 10a, and 10b to reduce the absorption of the ultraviolet ray emitted from the light-emitting layer 4 into an energy level caused by Mg in the second p-type AlGaN layer 6, thus enhancing the optical output power thereof.

The ultraviolet light-emitting elements 10, 10a, and 10b do not have to be LED chips emitting an ultraviolet ray but may also be, for example, laser diode chips (LD chips) emitting an ultraviolet ray.

REFERENCE SIGNS LIST

1 Substrate
1a One Surface
3 n-type AlGaN Layer
3a Surface
3aa Portion
4 Light-Emitting Layer
41 Well Layer
42 Barrier Layer
5 First p-type AlGaN Layer
6 Second p-type AlGaN Layer
6a Surface
60 Surface Region
8 Negative Electrode
9 Positive Electrode
10, 10a, 10b Ultraviolet Light-Emitting Element
20 Multilayer Stack

The invention claimed is:

1. An ultraviolet light-emitting element, comprising:
a multilayer stack in which an n-type AlGaN layer having a first surface and a second surface, a light-emitting layer, a first p-type AlGaN layer, and a second p-type AlGaN layer are arranged such that:
the light-emitting layer is provided on the first surface of the n-type AlGaN layer,
the first p-type AlGaN layer is provided on one surface of the light-emitting layer, and
the second p-type AlGaN layer is provided on one surface of the first p-type AlGaN layer, the second p-type AlGaN layer having a single-layer structure and being a continuous layer;
wherein
a negative electrode is provided directly on a portion, not covered with the light-emitting layer, of the first surface of the n-type AlGaN layer, the first surface being located closer to the light-emitting layer than the second surface; and
a positive electrode provided directly on a surface of the second p-type AlGaN layer, the positive electrode making an ohmic contact with the second p-type AlGaN layer,
the light-emitting layer having a multi-quantum well structure in which a plurality of barrier layers and a plurality of well layers are alternately arranged,
each of the plurality of well layers being configured as a first AlGaN layer,
each of the plurality of barrier layers being configured as a second AlGaN layer having an Al composition ratio larger than an Al composition ratio of the first AlGaN layer, the Al composition ratio in a layer being the molar fraction of Al among the total moles of Al and Ga in the layer,
the n-type AlGaN layer having an Al composition ratio larger than the Al composition ratio of the first AlGaN layer,
the first p-type AlGaN layer having an Al composition ratio larger than the Al composition ratio of the first AlGaN layer,
the second p-type AlGaN layer having an Al composition ratio larger than the Al composition ratio of the first AlGaN layer,
the first p-type AlGaN layer and the second p-type AlGaN layer both containing Mg,
the second p-type AlGaN layer having a maximum Mg concentration higher than a maximum Mg concentration of the first p-type AlGaN layer,
the second p-type AlGaN layer including a region where an Mg concentration increases in a thickness direction of the second p-type AlGaN layer as a distance from the first p-type AlGaN layer increases in the thickness direction,
wherein
the Mg concentration of the second p-type AlGaN layer equals the maximum Mg concentration of the second p-type AlGaN layer at a depth halfway through the second p-type AlGaN layer in the thickness direction of the second p-type AlGaN layer.

2. The ultraviolet light-emitting element of claim 1, wherein
in an Mg concentration profile in the thickness direction of the second p-type AlGaN layer, the maximum Mg concentration of the second p-type AlGaN layer is higher than $3\times10^{20}$ cm$^{-3}$ and lower than $6\times10^{20}$ cm$^{-3}$.

3. The ultraviolet light-emitting element of claim 1, wherein
the Al composition ratio of the second p-type AlGaN layer increases as the Mg concentration increases in the thickness direction of the second p-type AlGaN layer.

4. The ultraviolet light-emitting element of claim 1, comprising a substrate supporting the multilayer stack,
wherein the multilayer stack is provided on one surface of the substrate such that:
the n-type AlGaN layer is provided on the one surface of the substrate,
the light-emitting layer is provided on the first surface of the n-type AlGaN layer,
the first p-type AlGaN layer is provided on the one surface of the light-emitting layer, and
the second p-type AlGaN layer is provided on the one surface of the first p-type AlGaN layer.

5. The ultraviolet light-emitting element of claim 2, wherein
the Al composition ratio of the second p-type AlGaN layer increases as the Mg concentration increases in the thickness direction of the second p-type AlGaN layer.

* * * * *